(12) United States Patent
Trombetti (10) Patent No.: US 9,075,100 B2
(45) Date of Patent: Jul. 7, 2015

(54) METHOD, DEVICE AND CIRCUITRY FOR DETECTING A FAILURE ON A DIFFERENTIAL BUS

(71) Applicant: Infineon Technologies AG, Neubiberg (DE)

(72) Inventor: Daniela Trombetti, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 50 days.

(21) Appl. No.: 13/906,218

(22) Filed: May 30, 2013

(65) Prior Publication Data

US 2014/0355160 A1     Dec. 4, 2014

(51) Int. Cl.

| | |
|---|---|
| *G01R 31/04* | (2006.01) |
| *G01R 31/317* | (2006.01) |
| *H04B 17/00* | (2015.01) |
| *H04L 25/02* | (2006.01) |
| *H04B 3/46* | (2015.01) |
| *H04L 25/08* | (2006.01) |
| *G01R 31/02* | (2006.01) |

(52) U.S. Cl.
CPC ........ *G01R 31/04* (2013.01); *G01R 31/31703* (2013.01); *H04B 17/00* (2013.01); *H04L 25/0274* (2013.01); *H04B 3/46* (2013.01); *H04L 25/085* (2013.01); *G01R 31/025* (2013.01)

(58) Field of Classification Search
CPC .............. H04L 24/0274; H04L 24/085; H04L 25/0274; H04L 25/085; G01R 31/31703; G01R 31/04; G01R 31/025; H04B 17/0022; H04B 3/46; H04B 17/00
USPC .......................................................... 361/86
See application file for complete search history.

(56) References Cited

U.S. PATENT DOCUMENTS

| | | | |
|---|---|---|---|
| 6,281,699 B1 * | 8/2001 | Bishop ................ | 324/750.01 |
| 2004/0153223 A1 * | 8/2004 | Fujita et al. ................. | 701/29 |

* cited by examiner

*Primary Examiner* — Scott Bauer
(74) *Attorney, Agent, or Firm* — SpryIP, LLC (57) ABSTRACT

An exemplary embodiment relates to a method for detecting a failure on a differential bus comprising the steps: detecting a first signal between the bus lines, detecting a second signal between the bus lines, and detecting the failure in case the first signal and the second signal do not show the same absolute value or in case the first signal and the second signal do not show nearly the same absolute value.

21 Claims, 4 Drawing Sheets

METHOD, DEVICE AND CIRCUITRY FOR DETECTING A FAILURE ON A DIFFERENTIAL BUS

BACKGROUND OF THE INVENTION

Embodiments of the present invention relate to failure detection on a differential bus.

The detection of a failure in high speed networks can represent a complicated task due to the high variability of the network parameters, ground shift, common mode choke (CMC) effects as well as external disturbances.

SUMMARY

A first embodiment relates to a method for detecting a failure on a differential bus comprising the steps: detecting a first signal between bus lines of the differential bus, detecting a second signal between the bus lines, and detecting the failure in case the first signal and the second signal do not show the same absolute value or in case the first signal and the second signal do not show nearly the same absolute value.

A second embodiment relates to a device for detecting a failure on a differential bus, wherein said device comprises a processing unit arranged for detecting a first signal between bus lines of the differential bus, detecting a second signal between the bus lines, and detecting the failure in case the first signal and the second signal do not show the same absolute value or in case the first signal and the second signal do not show nearly the same absolute value.

A third embodiment relates to a device for detecting a failure on a differential bus, said device comprising means for detecting a first signal between bus lines of the differential bus, means for detecting a second signal between the bus lines, and means for detecting the failure in case the first signal and the second signal do not show the same absolute value or in case the first signal and the second signal do not show nearly the same absolute value.

A forth embodiment is directed to a circuitry for detecting a failure on a differential bus with a first bus line and a second bus line comprising
- a first memory for storing a first signal between bus lines of the differential bus,
- a second memory for storing a second signal between the bus lines,
- a unit that provides a predefined offset signal,
- a comparator for comparing the first memory with the second memory and with the predefined offset signal,
- a switching unit for
  - connecting either the first bus line with a first node and the second bus line with a second node or the first bus line with the second node and the second bus line with the first node;
  - connecting during a first phase the bus lines with the first memory;
  - connecting during a second phase the bus lines with the second memory;
  - connecting during a comparison phase the first memory and the second memory and the unit that provides the predefined offset signal to the comparator,
- wherein the comparator detects the failure
  - in case the signal stored in the first memory and the signal stored in the second memory do not show the same absolute value or
  - in case the signal stored in the first memory and the signal stored in the second memory differ (e.g., in absolute value) from each other by more than the predefined offset signal.

A fifth embodiment relates to a system comprising at least one device as described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

The examples in particular refer to a detection of (e.g., physical) bus failures in a differential data-bus environment, e.g., network, in which symmetrical data may be used for data transmission purposes. An exemplary differential bus system utilizes the FlexRay protocol. For details on the FlexRay protocol, reference is made to http://en.wikipedia.org/wiki/FlexRay.

The approach is in particular useful utilizing a differential bus that is able of symmetrical transmission. Such bus could be based on, e.g., FlexRay or CAN.

A failure is flagged in case of a bus wire is short-circuited to a fix potential. Such potential may be, e.g., ground (GND), supply voltage (VCC) or battery voltage (VBAT). Accordingly, other fix potentials may be used.

The solution presented herein allows detecting a failure, if ground shifts affect the network. For example, ground shifts up to 5V can occur in automotive networks (bus systems).

The solution presented in particular allows comparing a differential mode voltage on a bus (also referred to as DM bus voltage) during a signal "Data_1" (VTX1) with a DM bus voltage during a signal "Data_0" (VTX0). Data_1 may indicate a signal corresponding to logic "1" and Data_0 may indicate a signal corresponding to logic "0". Both, Data_0 and Data_1 are differential signals that may be used to encode a single bit of information on a differential bus system.

An error may be determined, e.g., indicated or reported, when the signals Data_0 and Data_1 are not symmetrical, in particular in case they do not show the same absolute value in voltage, i.e.

$$|VTX1+VTX0|>\Delta V_{ERR}.$$

$\Delta V_{ERR}$ may be regarded as a tolerance level (threshold) based on, e.g., network and/or transmitter asymmetries. The threshold level thus indicates a (slight) deviation between the absolute values of Data_0 and Data_1, wherein both signals are still considered symmetrical.

Hence, advantageously, detection ranges may improve. The solution further reduces the impact of a common mode choke (CMC) enabling improved dynamic detection ranges.

Also, during normal operation (i.e. in case of no failure), the solution is insensitive to ground shifts (and therefore also immune to common mode (CM) current that may be generated based on such ground shift), external CM disturbances and to variations of network parameters (e.g., bus load, supply voltage and other variations which may affect Data_0 and/or Data_1). Hence, the risk of detecting a fake failure (i.e. a failure when actually there is no such failure) is reduced.

It is also an advantage that the failure can be detected by comparing two voltages. Hence, no current-to-voltage conversion is required.

Failure detection can be reached during transmission, comparing the differential mode (DM) voltage generated on the bus during the signal Data_1 (VTX1) with the one generated on the bus during the signal Data_0 (VTX0).

Hence, in particular at least one of the following steps may be conducted:
(a) A DM voltage on the bus during the signal Data_1 (VTX1) is determined and stored.
(b) A DM voltage on the bus during the signal Data_0 (VTX0) is determined and stored.
(c) The two voltages VTX1 and VTX0 are compared. If they are not substantially or fully symmetrical, a failure may be reported. As described a tolerance $\Delta V_{ERR}$ between the voltages VTX1 and VTX0 can be utilized to determine whether the two voltages VTX1 and VTX0 are nearly symmetrical. This tolerance may reflect effects of the implementation or circuitry that may influence the symmetry. The voltages VTX1 and VTX0 are thus considered symmetric in case they have the same absolute value or such absolute values deviate by less than said tolerance.

Two comparison operations may be conducted, i.e.

$$VTX1+VTX0 < -\Delta V_{ERR} \text{ and}$$

$$VTX1+VTX0 > \Delta V_{ERR}$$

These comparison operations may be performed simultaneously using, e.g., two comparators, or they can be performed subsequently utilizing, e.g., a single comparator.
(d) A failure state may be flagged, if one failure condition is true, i.e. in case one of the comparison operations is fulfilled.
As an option, the failure state may be updated every two comparisons. Based on the failure state, a predefined action can be triggered, e.g., an alarm notification can be issued, a mode change of the device may occur, or a safe state can be entered. Also, a maintenance action can be initiated based on the failure state. It is also an option to wait for a predefined number of failures until flagging an error. This may in particular part of a maintenance action.

Figure 1:
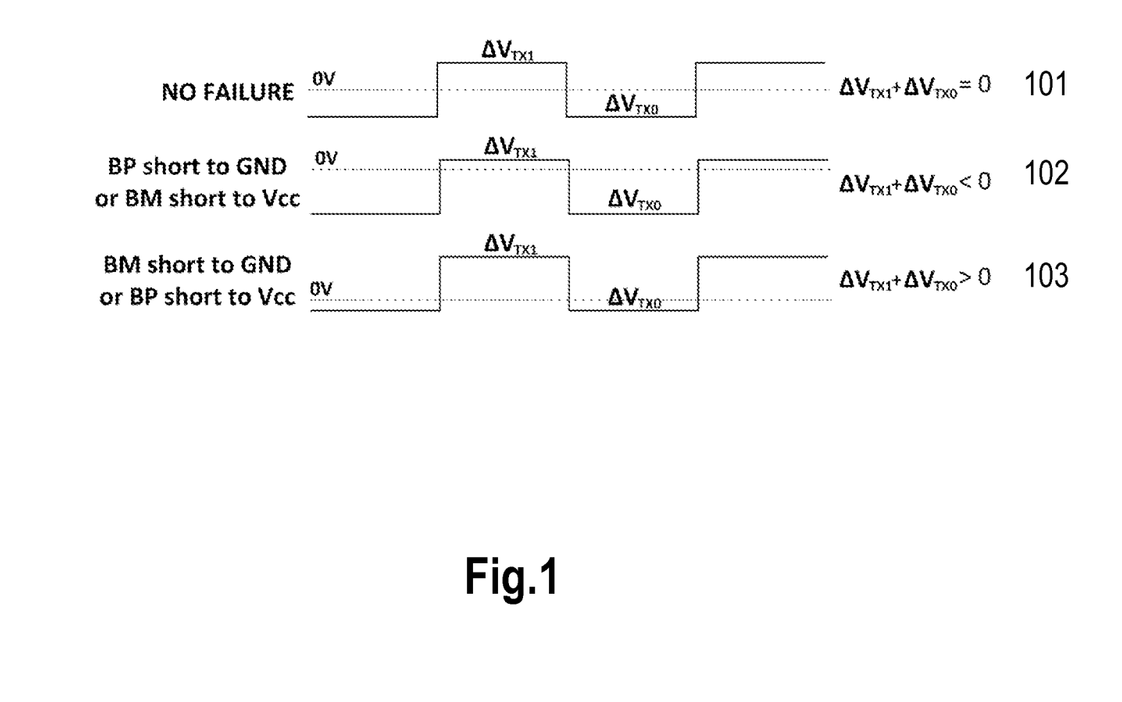
FIG. 1 shows an asymmetry detection approach based on the comparison operations as introduced above.

FIG. 1 shows an asymmetry detection approach based on the comparison operations as introduced above.

In normal operation 101 the signals VTX1 and VTX0 are equal in absolute value, i.e.

$$VTX1+VTX0=0.$$

This applies even if their magnitude depends on the transmitter design and network parameters. Neither ground shifts nor common mode currents affect the symmetry between the two signals. No fake failure is flagged during proper operation.

In case of a failure 102 or a failure 103, the symmetry between the signals VTX1 and VTX0 does no longer exist. In case of the failure 102, the positive bus line is short-circuited to GND or the negative bus line is short-circuited to VCC. In case of the failure 103, the positive bus line is short-circuited to VCC or the negative bus line is short circuited to GND.

The asymmetry can be determined by comparing the two signals (voltages) VTX1 and VTX0, an error can be flagged and/or reported when $$|VTX1+VTX0| > \Delta V_{ERR}.$$

Figure 2:
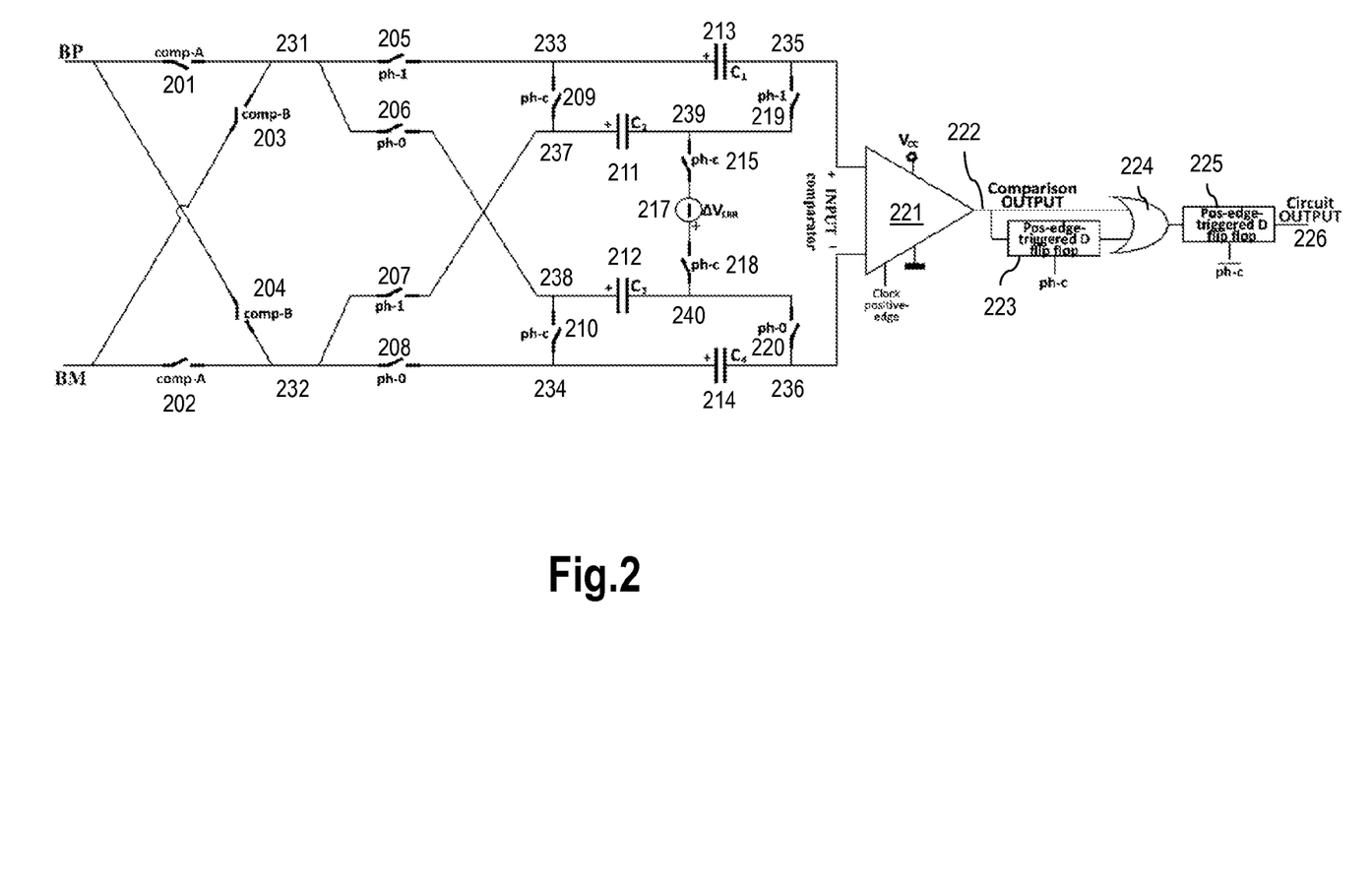
FIG. 2 shows an exemplary circuitry for an asymmetry detection concept of a failure.

Exemplary Circuit Arrangement:

FIG. 2 shows an exemplary circuitry for an asymmetry detection concept of a failure. A differential bus comprises a positive bus line BP and a negative bus line BM.

The positive bus line BP is connected via a switch 201 to a node 231 and via a switch 204 to a node 232. The negative bus line BM is connected via a switch 203 to the node 231 and via a switch 202 to the node 232.

The node 231 is connected via a switch 205 to a node 233 and via a switch 206 to a node 238. The node 232 is connected via a switch 208 to a node 234 and via a switch 207 to a node 237.

The node 233 is connected via a switch 209 with the node 237. The node 238 is connected via a switch 210 with the node 234. The node 233 is connected via a capacitor 213 to a node 235. The node 234 is connected via a capacitor 214 to a node 236.

The node 237 is connected via a capacitor 211 to a node 239. The node 239 is connected via a switch 219 to the node 235. The node 238 is connected via a capacitor 212 to a node 240. The node 240 is connected via a switch 220 to the node 236.

The node 239 is connected via a switch 215 to a unit 217 and the node 240 is connected via a switch 218 to the unit 217. The unit 217 supplies a threshold voltage $\Delta V_{ERR}$, wherein the positive pole of this unit 217 (voltage source) is connected to the switch 218 and the negative pole of the unit 217 is connected to the switch 215.

The unit 217 may supply a reference voltage $\Delta V_{ERR}$, which is obtained via a resistor $R_{VERR}$ that is connected to the supply voltage VCC via another resistor and to ground GND via a current source Iref. The voltage across the resistor $R_{VERR}$ corresponds to the reference voltage $\Delta V_{ERR}$. It may in particular be (substantially) constant over temperature changes.

The node 235 is further connected to the non-inverting terminal of a comparator unit 221 and the node 236 is further connected to the inverting terminal of the comparator unit 221. The output 222 of the comparator unit 221 is connected to the first input of an OR gate 224 and via a positive-edge triggered D flip flop 223 to the second input of the OR gate 224. The output of the OR gate 224 is connected to the input of a positive-edge triggered D flip flop 225 and the output of the positive-edge triggered D flip flop 225 provides an output signal 226.

The comparator unit 221 is connected to VCC and GND. The comparator unit 221 is active during the comparison phase ph-c and the input pins of the comparator unit 221 may be at the same potential during the phase1 and/or during the phase0, e.g., by short-circuiting them. For example, the comparator unit 221 can be driven by a comparison phase signal ph-c 306 and it may comprise a positive-edge triggered D flip flop that is driven by a clock positive edge signal 307 (see also FIG. 3). The positive-edge triggered D flip flop 223 is controlled with the comparison phase signal ph-c 306 and the positive-edge triggered D flip flop 225 is supplied with an inverted comparison phase signal ph-c.

Hence, the bus voltages VTX1 and VTX0 applied via bus lines BP and BM during Data_1 and Data_0 are stored in capacitors, respectively during a phase1 (ph-1) and a phase0 (ph-0) and are compared in the comparison phase ph-c.

The switches described herein can be electronic switches, e.g., transmission gates, transistors, in particular MOSFETs, that may be controlled by a control unit applying the different states phase0, phase1 and comparison phase.

Figure 3:
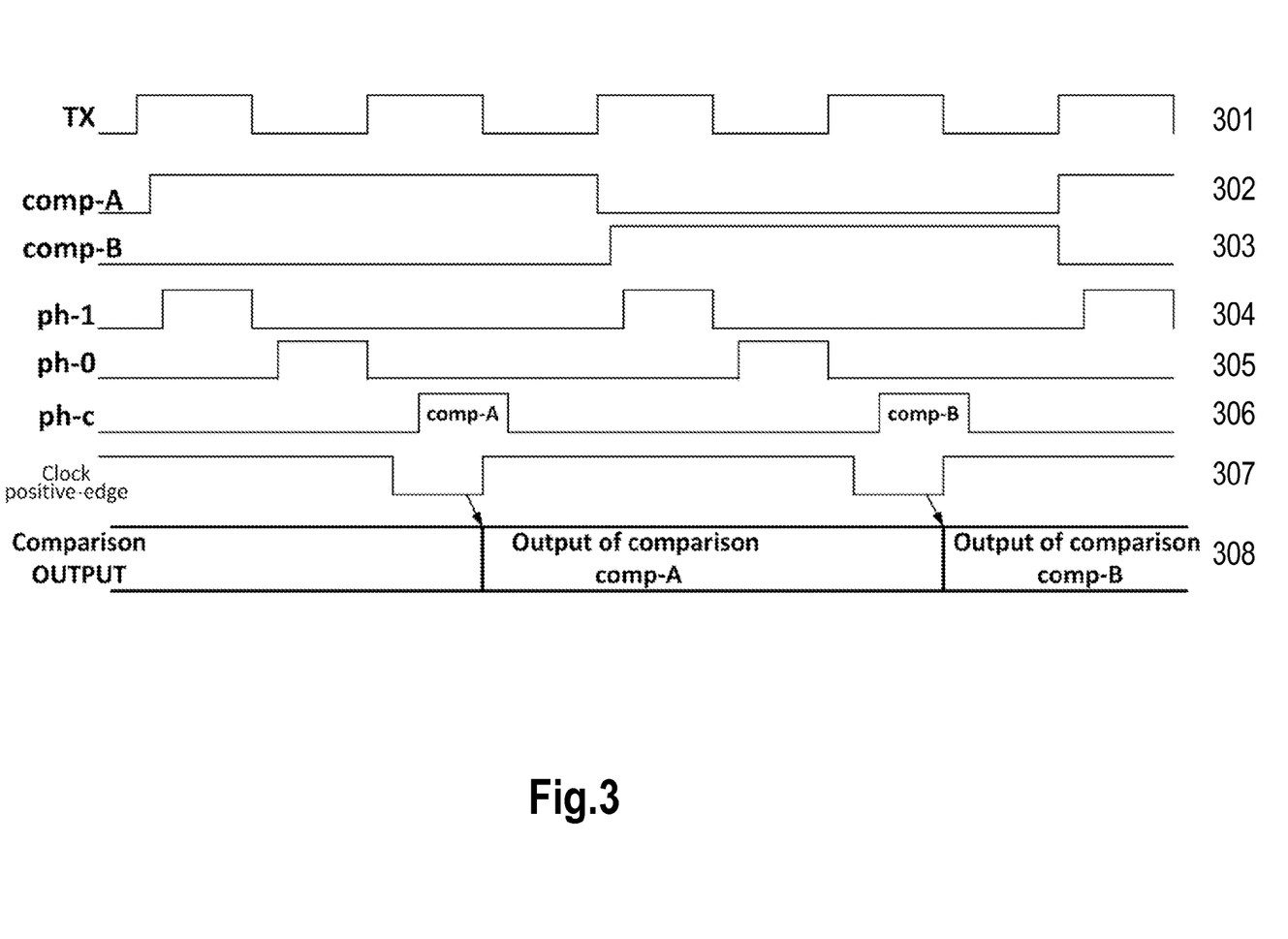
FIG. 3 shows a logic diagram comprising several signals driving the circuitry shown on FIG. 2.

FIG. 3 shows a logic diagram comprising several signals used to drive the circuitry shown on FIG. 2. Saving and comparison phases are generated utilizing the circuitry of FIG. 2. FIG. 3 shows a digital transmission signal Tx 301 that is exemplarily taken as a basis for generating the subsequent signals. The signals generated may preferably avoid any overlapping in order not to spoil the sampled signals across the capacitors and in order not to short-circuit the bus wires BP and BM.

A comparison comp-A phase is shown as a signal 302, a comparison comp-B phase is shown as a signal 303. The phase1 ph-1 is indicated in a signal 304 and the phase0 ph-0 is visualized as a signal 305. The comparison phase ph-c (which may be the inverted delayed positive-edge clock signal 307) is shown as a signal 306. A signal 307 indicates a clock positive-edge signal that is applied to the comparator unit 221. Based on the signal 307, a signal 308 at the output 222 of the comparator unit 221 is generated (also referred to as "Comparison OUTPUT").

Figure 4:
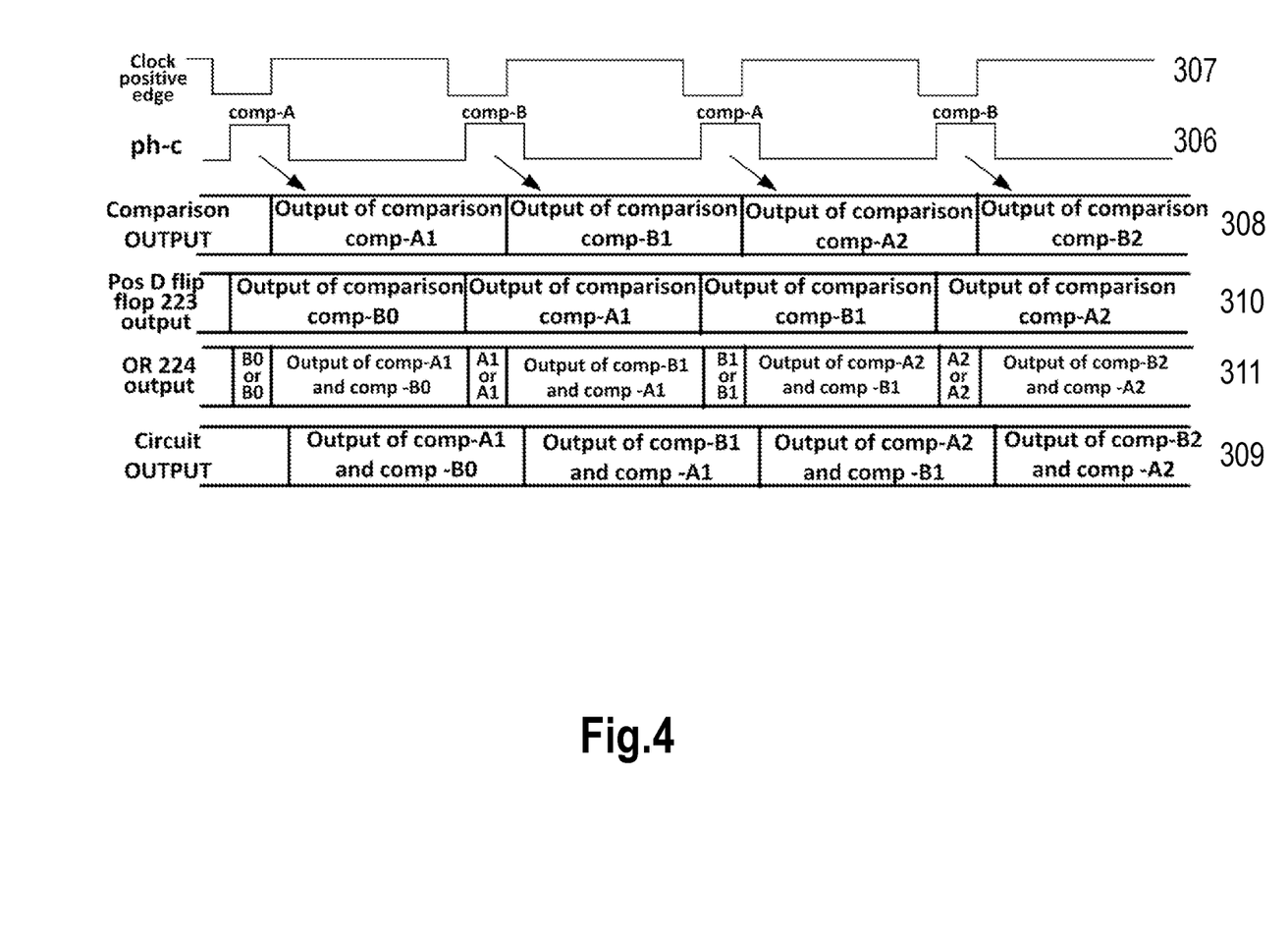
FIG. 4 shows a logic diagram based on the circuitry of FIG. 2 and on the logic diagram of FIG. 3.

FIG. 4 shows a logic diagram based on the circuitry of FIG. 2 and on the logic diagram of FIG. 3. The signals 306, 307 and 308 are also shown in FIG. 3. A signal 310 shows the signal at the output of the D flip flop 223 and a signal 311 shows the signal at the output of the OR gate 224. A signal 309 shows the signal at the circuit output 226 of FIG. 2, i.e. after the logic comprising the positive-edge triggered D flip flops 223, 225 and the OR gate 224 supplying the output of the comparison comp-A and the comparison comp-B.

Two comparisons are performed: A first comparison also referred to as comp-A $$\text{Data\_1+Data\_0} < -\Delta V_{ERR}$$

and a second comparison, also referred to as comp-B $$\text{Data\_1+Data\_0} > \Delta V_{ERR}.$$

The comparison comp-A utilizes the switches 201 and 202 and the comparison comp-B utilizes the switches 203 and 204. The switches for comparison comp-A and the switches for comparison comp-B alternate the polarity of the connection between the circuitry and the bus (i.e. its signals BP and BM), which allows using a single circuitry for conducting both comparisons.

For each of the comparisons, three phases may be utilized:
(1) Phase1 (ph-1): Data_1 is saved in the capacitor 213 (also referred to as capacitor C1) and in the capacitor 211 (also referred to as capacitor C2).
(2) Phase0 (ph-0): Data_0 is saved in the capacitor 212 (also referred to as capacitor C3) and in the capacitor 214 (also referred to as capacitor C4).
(3) Comparison phase (ph-c): The two saved voltages for Data_1 and Data_0 are compared.

Phase1 is associated with the switches 205, 207 and 219, phase0 is associated with the switches 206, 208 and 220 and the comparison phase ph-c is associated with the switches 209, 210, 215 and 218.

The output 222 of the comparator unit 221 may be processed via a positive-edge triggered D flip flop to sample and hold the result of the comparison.

When a failure condition is determined, i.e.

$$\text{Data\_1+Data\_0} < -\Delta V_{ERR} \text{ for the comparison comp-}A$$

or $$\text{Data\_1+Data\_0} > \Delta V_{ERR} \text{ for the comparison comp-}B,$$

the output 222 is high. In case no failure is detected, the output 222 is low.

The Comparison OUTPUT will toggle in case of failure, while it will remain low in case of normal operating.

The two positive-edge triggered D flip flops 223 and 225 and the OR gate 224 allow having a stable output signal 226 also in case of a failure. The signal at the output 226 considers both comparisons comp-A and comp-B in order to define whether a failure condition has to be flagged or not. A counter or additional digital logic can be used to flag a failure only after a minimum number of subsequently satisfied failure conditions.

The positive-edge triggered D flip flop 223 stores the signal at the output 222 at the positive edge of the signal ph-c 306 and feeds it to the second input of the OR gate 224. The output of the OR gate 224 is high if the output 222 or the signal supplied by the D flip flop 223 is high.

The positive-edge triggered D flip flop 225 samples the output of the OR gate 224 at the negative edge of the signal ph-c 306. Temporary unwanted output signals provided by the OR gate 224 are skipped and/or filtered out.

First Comparison Operation:

The following applies to the first comparison operation, i.e.

$$\text{Data\_1+Data\_0} < -\Delta V_{ERR}$$

when the switches 201 and 202 for comp-A are closed and the switches 203 and 204 for comp-B are open.

The phases ph-1, ph-0 and ph-c can be summarized as follows:
(1) Phase1 (ph-1):
The switches 205, 207 and 219 for phase1 are closed; the switches 206, 208 and 220 for phase0 are open and the switches 209, 210, 215 and 218 for the comparator phase ph-c are open as well. Data_1 is saved across the capacitor C1 and the capacitor C2:

$$V_{C1} = V_{BP1} - V_{comp1a};$$

$$V_{C2} = V_{BM1} - V_{comp1a};$$

wherein $V_{c1}$ is the voltage at the capacitor $C_1$, $V_{C2}$ is the voltage at the capacitor C2, $V_{BP1}$ is a voltage during phase1 at the bus line BP, $V_{BM1}$ is a voltage during phase1 at the bus line BM and $V_{comp1a}$ is the voltage at the comparator during phase1 of this comparison operation comp-A.

Hence, the voltage signal Data_1 can be determined as follows:

$$V_{C1} - V_{C2} = V_{BP1} - V_{BM1} = \text{Data\_1}.$$

(2) Phase0 (ph-0):
The switches 206, 208 and 220 for phase0 are closed, the switches 205, 207 and 219 for phase1 are open and the switches 209, 210, 215 and 218 for the comparator phase ph-c are open as well. Data_0 is saved across the capacitor C3 and the capacitor C4:

$$V_{C3} = V_{BP0} - V_{comp0a};$$

$$V_{C4} = V_{BM0} - V_{comp0a};$$

wherein $V_{C3}$ is the voltage at the capacitor C3, $V_{C4}$ is the voltage at the capacitor C4, $V_{BP0}$ is a voltage during phase0 at the bus line BP, $V_{BM0}$ is a voltage during phase0 at the bus line BM and $V_{comp0a}$ is the voltage at the comparator during phase0 of this comparison operation comp-A.

Hence, the voltage signal Data_0 can be determined as follows:

$$V_{C3}-V_{C4}=V_{BP0}-V_{BM0}=\text{Data\_0}.$$

(3) Comparison phase (ph-c):
The switches 209, 210, 215 and 218 for the comparator phase ph-c are closed, the switches 206, 208 and 220 for phase0 are open and the switches 205, 207 and 219 for phase1 are open as well. The comparator unit 221 is in active mode (operating, comparing its input terminals).
The voltages across the capacitors C1, C2, C3 and C4 are added and they are added to the tolerance voltage $\Delta V_{ERR}$.
A voltage $V_{IComp}$ at the input terminals of the comparator unit 221 (i.e. between the nodes 235 and 236) amounts to:

$$\begin{aligned} V_{IComp} &= -V_{C1} + V_{C2} - \Delta V_{ERR} - V_{C3} + V_{C4} \\ &= -V_{BP1} + V_{BM1} - \Delta V_{ERR} - V_{BP0} + V_{BM0} \\ &= -\text{Data\_1} - \text{Data\_0} - \Delta V_{ERR} \end{aligned}$$

In case this voltage $V_{IComp}$ is larger than zero the following applies:

$$\text{Data\_1}-\text{Data\_0}-\Delta V_{ERR}>0$$

$$\text{Data\_1}+\text{Data\_0}<-\Delta V_{ERR}$$

Second Comparison Operation:
The following applies to the second comparison operation, i.e.

$$\text{Data\_1}+\text{Data\_0}>\Delta V_{ERR}$$

when the switches 203 and 204 for comp-B are closed and the switches 201 and 202 for comp-A are open.
The phases ph-1, ph-0 and ph-c can be summarized as follows:
(1) Phase1 (ph-1):
The switches 205, 207 and 219 for phase1 are closed; the switches 206, 208 and 220 for phase0 are open and the switches 209, 210, 215 and 218 for the comparator phase ph-c are open as well. Data_1 is saved across the capacitor C1 and the capacitor C2:

$$V_{C1}=V_{BM1}-V_{comp1b};$$

$$V_{C2}=V_{BP1}-V_{comp1b},$$

wherein $V_{comp1b}$ is the voltage at the comparator during phase1 of this comparison operation comp-B.
Hence, the voltage signal Data_1 can be determined as follows:

$$V_{C1}-V_{C2}=V_{BM1}-V_{BP1}=-\text{Data\_1}.$$

(2) Phase0 (ph-0):
The switches 206, 208 and 220 for phase0 are closed, the switches 205, 207 and 219 for phase1 are open and the switches 209, 210, 215 and 218 for the comparator phase ph-c are open as well.
Data_0 is saved across the capacitor C3 and the capacitor C4:

$$V_{C3}=V_{BM0}-V_{comp0b};$$

$$V_{C4}=V_{BP0}-V_{comp0b},$$

wherein $V_{comp0b}$ is the voltage at the comparator during phase0 of this comparison operation comp-B.

Hence, the voltage signal Data_0 can be determined as follows:

$$V_{C3}-V_{C4}=V_{Bm0}-V_{BP0}=-\text{Data\_0}.$$

(3) Comparison phase (ph-c):
The switches 209, 210, 215 and 218 for the comparator phase ph-c are closed, the switches 206, 208 and 220 for phase0 are open and the switches 205, 207 and 219 for phase1 are open as well. The comparator unit 221 is in active mode (operating, comparing its input terminals).
The voltages across the capacitors C1, C2, C3 and C4 are added and they are added to the tolerance voltage $\Delta V_{ERR}$.
The voltage $V_{IComp}$ at the input terminals of the comparator unit 221 (i.e. between the nodes 235 and 236) amounts to:

$$\begin{aligned} V_{IComp} &= -V_{C1} + V_{C2} - \Delta V_{ERR} - V_{C3} + V_{C4} \\ &= -V_{BM1} + V_{BP1} - \Delta V_{ERR} - V_{BM0} + V_{BP0} \\ &= -\text{Data\_1} + \text{Data\_0} - \Delta V_{ERR} \end{aligned}$$

In case this voltage $V_{IComp}$ is larger than zero the following applies:

$$\text{Data\_1}+\text{Data\_0}-\Delta V_{ERR}>0$$

$$\text{Data\_1}+\text{Data\_0}>\Delta V_{ERR}$$

The examples suggested herein may in particular be based on at least one of the following solutions. In particular combinations of the following features could be utilized in order to reach a desired result. The features of the method could be combined with any feature(s) of the device or system or vice versa.

A method is suggested for detecting a failure on a differential bus comprising the steps:
  detecting a first signal between bus lines of the differential bus,
  detecting a second signal between the bus lines,
  detecting the failure in case the first signal and the second signal do not show the same absolute value or in case the first signal and the second signal do not show nearly the same absolute value.

According to an example, the comprises the step: detecting the failure in case the following condition is met:

$$|VTX1+VTX0|>\Delta V_{ERR},$$

wherein
  VTX0 is a voltage of the second signal,
  VTX1 is a voltage of the first signal,
  $\Delta V_{ERR}$ is a predetermined tolerance level.

In an embodiment, the method comprises the step: detecting the failure in case at least one of the following comparison operations is fulfilled:

$$VTX1+VTX0<-\Delta V_{ERR};$$

$$VTX1+VTX0>\Delta V_{ERR}.$$

In a further embodiment the comparison operations are performed simultaneously or subsequently.

According to a next embodiment each comparison comprises the following steps:
  store first signal;
  store second signal;
  compare the first signal with the second signal.

Pursuant to yet an embodiment, the method comprises at least one of the following steps after a failure is detected:
- issue an alarm notification;
- change state of a circuitry, device or system;
- enter a safe state;
- power down;
- initiate a maintenance action.

It is also an embodiment that the method comprises the step:
- detecting no failure in case the first signal and the second signal show the same absolute value or in case the first signal and the second signal show nearly the same absolute value.

In an embodiment, the first signal and the second signal are differential signals between two bus lines of the differential bus.

In a further embodiment, detecting the first signal and the second signal each comprises detecting a voltage of the respective first and second signal.

In another embodiment, the method is conducted during transmission of data on the differential bus.

According to an embodiment the differential bus is operated pursuant to a FlexRay protocol.

A device is suggested for detecting a failure on a differential bus, wherein said device comprises a processing unit arranged for
- detecting a first signal between bus lines of the differential bus,
- detecting a second signal between the bus lines,
- detecting the failure in case the first signal and the second signal do not show the same absolute value or in case the first signal and the second signal do not show nearly or substantially the same absolute value.

In an embodiment, the processing unit is arranged for conducting at least one of the following measures after a failure is detected:
- issue an alarm notification;
- change state of a circuitry, device or system;
- enter a safe state;
- power down;
- initiate a maintenance action.

Also, a device for detecting a failure on a differential bus is suggested, said device comprising
- means for detecting a first signal between bus lines of the differential bus,
- means for detecting a second signal between the bus lines,
- means for detecting the failure in case the first signal and the second signal do not show the same absolute value or in case the first signal and the second signal do not show nearly the same absolute value.

A circuitry for detecting a failure on a differential bus with a first bus line and a second bus line is suggested comprising
- a first memory for storing a first signal between bus lines of the differential bus,
- a second memory for storing a second signal between the bus lines,
- a unit that provides a predefined offset signal,
- a comparator for comparing the first memory with the second memory and with the predefined offset signal,
- a switching unit for
  - connecting either the first bus line with a first node and the second bus line with a second node or the first bus line with the second node and the second bus line with the first node;
  - connecting during a first phase the bus lines with the first memory;
  - connecting during a second phase the bus lines with the second memory;
  - connecting during a comparison phase the first memory and the second memory and the unit that provides the predefined offset signal to the comparator,
- wherein the comparator detects the failure
  - in case the signal stored in the first memory and the signal stored in the second memory do not show the same absolute value or
  - in case the signal stored in the first memory and the signal stored in the second memory differ from each other by more than the predefined offset signal.

In an embodiment, the first memory comprises at least one capacitor and the second memory comprises at least one capacitor.

In another embodiment the unit that provides a predefined offset signal comprises a voltage source.

In a next embodiment, the switching unit comprises electronic switches, in particular transmission gates, transistors or MOSFETs.

In yet an embodiment, the switching unit is arranged for conducting
- a first comparison by connecting the first bus line with the first node and the second bus line with the second node
- a second comparison by connecting the first bus line with the second node and the second bus line with the first node.

In another embodiment, the circuitry comprises a third memory that allows comparing the output of the comparator with a previous output of the comparator in order to combine the results of the first comparison and the second comparison.

A system is suggested comprising at least one device as described herein.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. Method for detecting a failure on a differential bus comprising:
   - detecting a first signal between bus lines of the differential bus,
   - detecting a second signal between the bus lines,
   - detecting the failure in case the first signal and the second signal do not show a same absolute value or in case the first signal and the second signal do not show nearly a same absolute value.

2. The method according to claim 1, wherein the detecting the failure act detects the failure in case the following condition is met:

$$|VTX1+VTX0|>\Delta VERR,$$

wherein
$VTX0$ is a voltage of the second signal,
$VTX1$ is a voltage of the first signal,
$\Delta VERR$ is a predetermined tolerance level.

3. The method according to claim 2, wherein the detecting the failure act detects the failure in case at least one of the following comparison operations are fulfilled:

$$VTX1+VTX0<-\Delta VERR;$$

$$VTX1+VTX0>\Delta VERR.$$

4. The method according to claim 3, wherein the comparison operations are performed simultaneously or subsequently.

5. The method according to claim 3, wherein each of the comparison operations comprises:
storing the first signal;
storing the second signal;
comparing the first signal with the second signal.

6. The method according to claim 1, further comprising at least one of the following acts after a failure is detected:
issuing an alarm notification;
changing a state of a circuitry, device or system;
entering a safe state;
powering down;
initiating a maintenance action.

7. The method according to claim 1, further comprising:
detecting no failure in case the first signal and the second signal show the same absolute value or in case the first signal and the second signal show nearly the same absolute value.

8. The method according to claim 1, wherein the first signal and the second signal are differential signals between two bus lines of the differential bus.

9. The method according to claim 1, wherein detecting the first signal and the second signal each comprises detecting a voltage of the respective first and second signal.

10. The method according to claim 1, wherein the method is conducted during transmission of data on the differential bus.

11. The method according to claim 1, wherein the differential bus is operated pursuant to a FlexRay protocol.

12. A device for detecting a failure on a differential bus, wherein said device comprises a processing unit arranged to
detect a first signal between bus lines of the differential bus,
detect a second signal between the bus lines,
detect the failure in case the first signal and the second signal do not show the same absolute value or in case the first signal and the second signal do not show nearly the same absolute value.

13. The device according to claim 12, wherein the processing unit is further arranged to conduct at least one of the following measures after a failure is detected:
issue an alarm notification;
change state of a circuitry, device or system;
enter a safe state;
power down;
initiate a maintenance action.

14. A system comprising at least one device according to claim 12.

15. A device for detecting a failure on a differential bus, said device comprising:
means for detecting a first signal between bus lines of the differential bus,
means for detecting a second signal between the bus lines,
means for detecting the failure in case the first signal and the second signal do not show the same absolute value or in case the first signal and the second signal do not show nearly the same absolute value.

16. A circuitry for detecting a failure on a differential bus with a first bus line and a second bus line comprising:
a first memory for storing a first signal between bus lines of the differential bus,
a second memory for storing a second signal between the bus lines,
a unit that provides a predefined offset signal,
a comparator for comparing the first memory with the second memory and with the predefined offset signal,
a switching unit to
connect either the first bus line with a first node and the second bus line with a second node or the first bus line with the second node and the second bus line with the first node;
connect during a first phase the bus lines with the first memory;
connect during a second phase the bus lines with the second memory;
connect during a comparison phase the first memory and the second memory and the unit that provides the predefined offset signal to the comparator,
wherein the comparator detects the failure
in case the signal stored in the first memory and the signal stored in the second memory do not show the same absolute value or
in case the signal stored in the first memory and the signal stored in the second memory differ from each other by more than the predefined offset signal.

17. The circuitry according to claim 16, wherein the first memory comprises at least one capacitor and the second memory comprises at least one capacitor.

18. The circuitry according to claim 16, wherein the unit that provides a predefined offset signal comprises a voltage source.

19. The circuitry according to claim 16, wherein the switching unit comprises electronic switches, in particular transmission gates, transistors or MOSFETs.

20. The circuitry according to claim 16, wherein the switching unit is arranged to conduct
a first comparison by connecting the first bus line with the first node and the second bus line with the second node,
a second comparison by connecting the first bus line with the second node and the second bus line with the first node.

21. The circuitry according to claim 20, comprising a third memory that allows comparing the output of the comparator with a previous output of the comparator in order to combine the results of the first comparison and the second comparison.

* * * * *